United States Patent
Tao

(10) Patent No.: US 7,102,241 B2
(45) Date of Patent: Sep. 5, 2006

(54) LEADLESS SEMICONDUCTOR PACKAGE

(75) Inventor: Su Tao, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 10/929,503

(22) Filed: Aug. 31, 2004

(65) Prior Publication Data

US 2005/0073032 A1    Apr. 7, 2005

(30) Foreign Application Priority Data

Sep. 1, 2003    (TW) ................ 92124114 A

(51) Int. Cl.
*H01L 23/29* (2006.01)
*H01L 23/48* (2006.01)
(52) U.S. Cl. ...................... 257/790; 257/779
(58) Field of Classification Search ............... 257/790, 257/791, 779
See application file for complete search history.

(56) References Cited

U.S. PATENT DOCUMENTS

| 5,331,205 A * | 7/1994 | Primeaux ................ 257/790 |
| 6,211,574 B1 * | 4/2001 | Tao et al. ................ 257/784 |
| 6,373,116 B1 * | 4/2002 | Teranuma et al. .......... 257/428 |
| 2001/0022404 A1 * | 9/2001 | Yamamoto et al. .......... 257/783 |
| 2004/0135121 A1 * | 7/2004 | Toyoda et al. ......... 252/301.16 |

* cited by examiner

*Primary Examiner*—Lex H. Malsawma
(74) *Attorney, Agent, or Firm*—Bacon & Thomas, PLLC

(57) ABSTRACT

A leadless semiconductor package disposed on a substrate includes a chip, a plurality of leads, wherein each lead has a metal layer and a first molding compound formed on the metal layer, a second molding compound disposed on the first molding compound, and a chip paddle for carrying the chip. The leads are connected to the chip by wire bonding technique. The metal layer is exposed out of the first molding compound; and the second molding compound encapsulates the chip with the chip paddle exposed out of the second molding compound.

9 Claims, 3 Drawing Sheets

LEADLESS SEMICONDUCTOR PACKAGE

BACKGROUND OF THE INVENTION

1. Field of Invention

This invention relates to a semiconductor package. More particularly, the present invention is related to a leadless semiconductor package with an encapsulation formed therein for reducing the thermal mismatch between the package and the substrate for carrying said package.

2. Related Art

A well-known semiconductor package, such as a bump chip carrier package (BCC) or a quad flat non-leaded (QFN) package is applicable to communication products, portable electronics products, low pin-counts package structure and packages for high-frequency chips, such as chip with a working frequency exceeding 12 GHz.

As mentioned above, the bump chip carrier package employs a plurality of flat contacts, for example metal contacts with a size of 0.4 mm* 0.3 mm, for electrically connecting the chip and the substrate. Besides, the bump chip carrier package has a chip paddle exposed so as to be attached to a substrate through solder materials. Thus, the thermal performance of such BCC package will be enhanced. In addition, the electrical performance of such a BCC package can be enhanced by employing a ground ring.

Referring to FIG. 1, it illustrates a conventional leadless semiconductor package or a bump chip carrier package 10. Such package 10 mainly comprises a chip 20, a chip paddle or a metal pad 22, a plurality of leads 24, a plurality of wires 26, a plurality of ground ring 30 and an encapsulation 28. The back surface 12 of the chip 20 is attached to the chip paddle 22, and the active surface 14 is electrically connected to the leads 24 or the ground rings 30 through the wires 26. The encapsulation 28 encapsulates the chip 20, the wires 26, and the ground ring 30 and leaves the chip paddle 22 and the leads 24 exposed out of the encapsulation 28.

Besides, referring to FIG. 2, the package 10 is attached to a printed circuit board or a substrate 40 through a solder material 44 by surface mount technology. However, when there is a lot of difference of the coefficient of thermal expansion of the encapsulation 28 from that of the printed circuits board 40, it is easy to cause thermal stress at the solder material 44 due to the changes of the working temperature. Thus, the solder material 44 usually bears a lot of cyclic stress so as to cause the fatigue damage and cracks at the solder materials 44. In such a manner, the package 10 and the printed circuits board 40 will not be able to operate well.

Therefore, providing another leadless semiconductor package to solve the mentioned-above disadvantages is the most important task in this invention.

SUMMARY OF THE INVENTION

In view of the above-mentioned problems, this invention is to provide a leadless semiconductor package having an encapsulation with a lower modulus so as to prevent the thermal mismatch between the package and the substrate.

To achieve these and other advantages and in accordance with the purpose of the invention, as embodied and broadly described herein, the invention specifically provides a leadless semiconductor package applicable to dispose on a substrate or a printed circuit board, wherein the leadless semiconductor package mainly comprises a chip, a plurality of leads, wherein each lead has a metal layer formed on a bottom of said each lead and a first encapsulation disposed on the metal layer, and a second encapsulation. Therein, the said each lead is protruded from the second encapsulation and electrically connected to the chip. In addition, the second encapsulation encapsulates the chip and leaves the chip exposed. However, there is further a chip paddle encapsulated in the second encapsulation and utilized for carrying the chip.

As mentioned above and to be noted, the modulus of the first encapsulation is lower than that of the second encapsulation, the thermal mismatch between the package and the substrate will be reduced so as to increase the reliability of such package when the package is attached and mounted to the printed circuit board or substrate.

It is to be understood that both the foregoing general description and the following detailed description are exemplary, and are intended to provide further explanation of the invention as claimed.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

Figure 1:
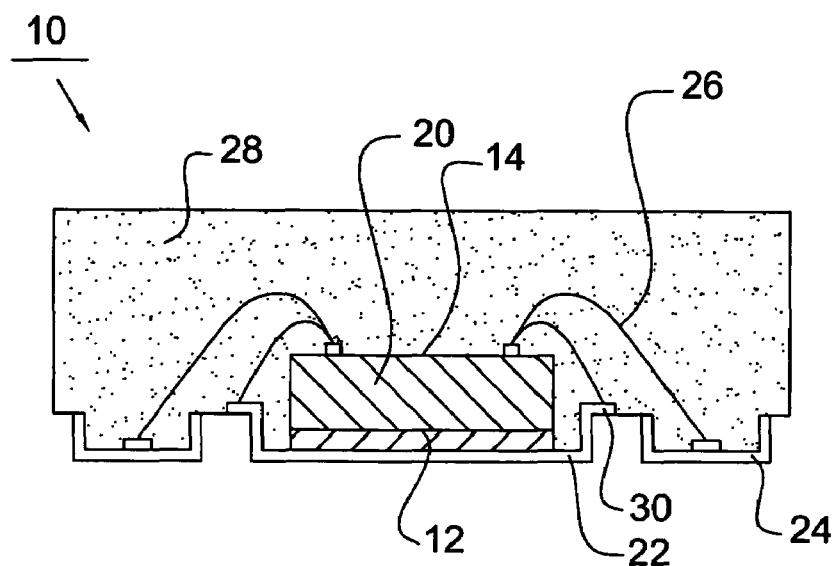
FIG. 1 is a cross-sectional view of a conventional leadless semiconductor package.
Figure 2:
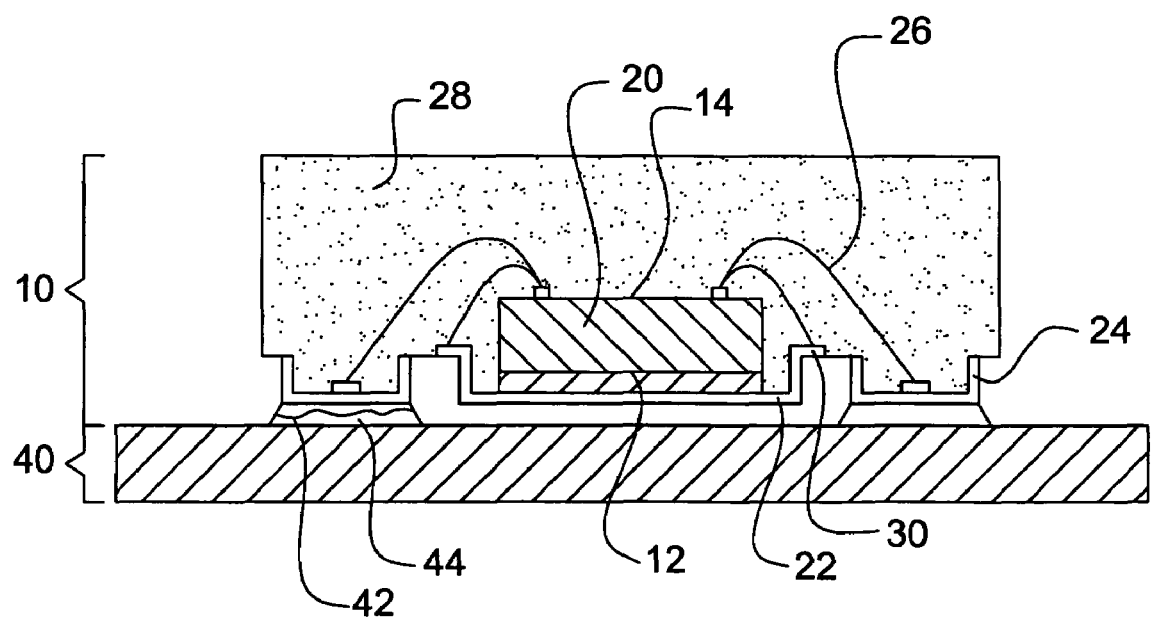
FIG. 2 is a cross-sectional view of a conventional leadless semiconductor package attached to a substrate.

The leadless semiconductor package according to the preferred embodiments of this invention will be described herein below with reference to the accompanying drawings, wherein the same reference numbers are used in the drawings and the description to refer to the same or like parts.

Figure 3:
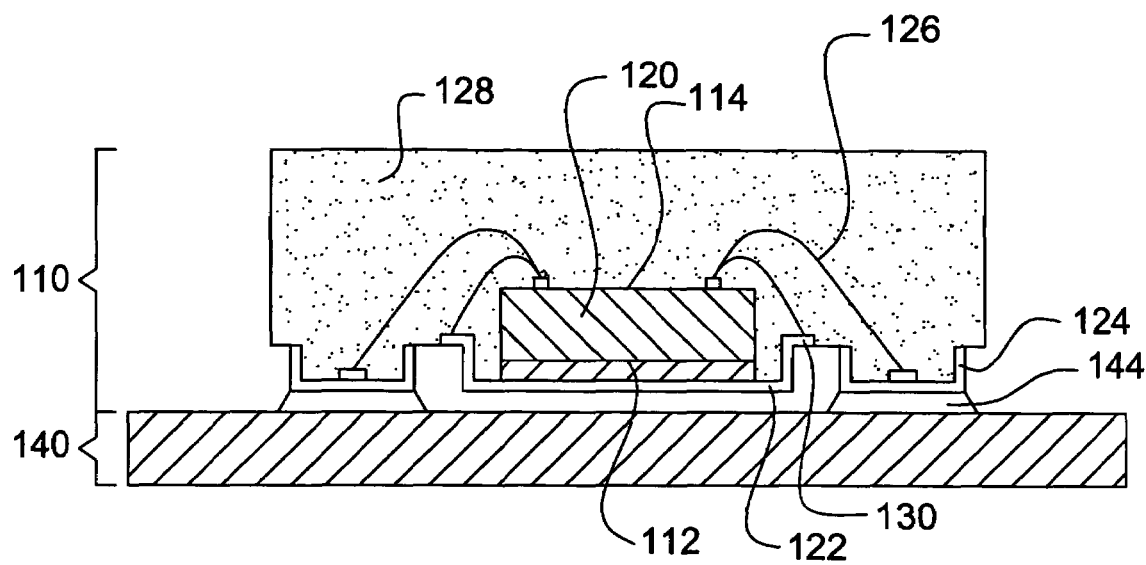
FIG. 3 is a cross-sectional view of a leadless semiconductor package attached to a substrate according to the preferred embodiment of the present invention.
Figure 4:
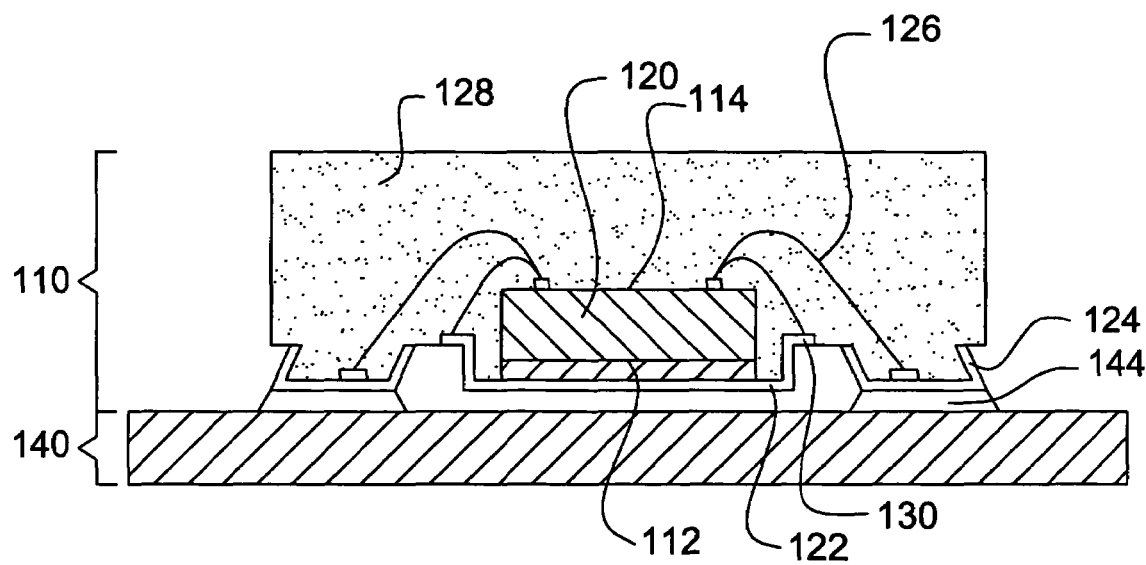
FIG. 4 is a cross-sectional view of FIG. 3 specifically showing the leads with the capability of complying with the substrate.

As shown in FIG. 3, it illustrates a first embodiment of this invention. The leadless semiconductor package 110, such as a bump chip carrier package or a quad flat non-lead (QFN), is attached to a substrate 140, such as a printed circuit board. Therein, the package 110 mainly comprises a chip 120, a chip paddle 122, a plurality of leads 124, a plurality of wires 126, a plurality of ground rings 130 and an encapsulation 128. The back surface 112 of the chip 120 is attached to the chip paddle 122 and the active surface 114 of the chip 120 is electrically connected to the leads 124 or the ground ring 130. Optionally, the ground ring 130 can be extended to the chip paddle 122. In addition, the leads 124 can be attached to the substrate 140 through solder materials 144 by surface mounting technology. To be noted, the difference of the coefficient of the thermal expansion of the encapsulation from that of the substrate is less than 5 ppm/° C.

As mentioned above, another way to reduce the thermal mismatch between the package 110 and the substrate 140 is to employ an encapsulation with a low modulus, such as silicone with a modulus less than 2 Mpa at the temperature of 25° C. In such a manner, the encapsulation 128 has lower modulus, namely, the encapsulation 128 can be easily to shape into another shapes. In other words, such package 110 has the capability of complying with the deformation of the substrate 140. Hence, the thermal stress at the solder materials 144 can be reduced so as to prevent the solder materials 144 from being damaged due to fatigue failure. Consequently, the reliability of solder materials 144 connecting the package 110 and the substrate 140 will be increased and improved.

Figure 5:
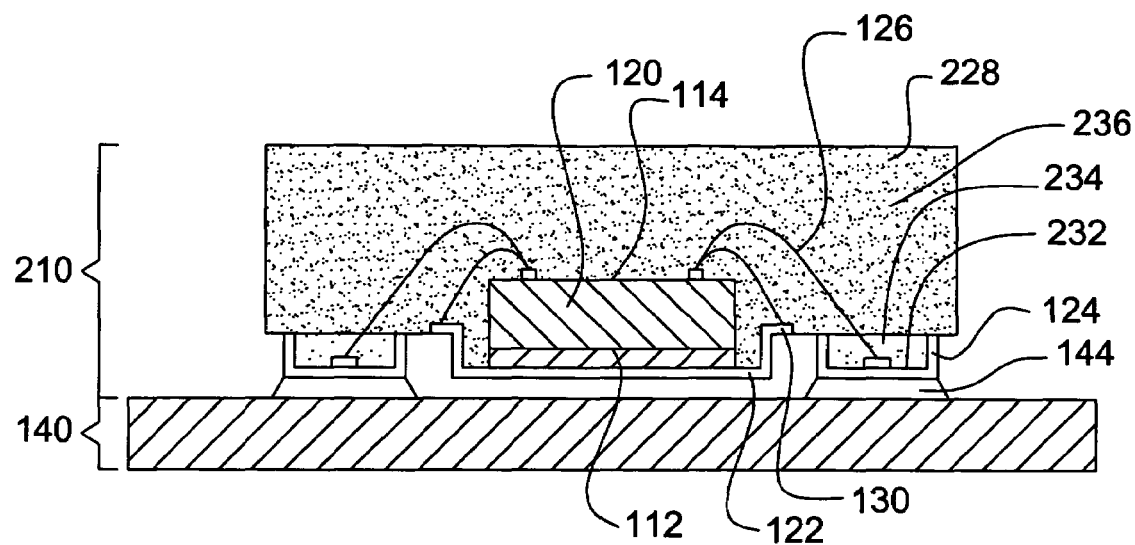
FIG. 5 is a cross-sectional view of a leadless semiconductor package attached to a substrate according to another preferred embodiment of the present invention.

Next, referring to FIG. 5, it illustrates another embodiment. Such package 210 is the same as the first embodiment, attached to a substrate 140. The difference of this embodiment from the first embodiment as shown above is that the package 210 mainly has two kinds of encapsulations formed therein. The first encapsulation 234 is disposed in recesses 232 of a metal panel, with a plated metal layer 124 formed on the recesses 232. Namely, the first encapsulation 234 and the metal layer 124 form the lead. Then, the chip 120 is disposed on the chip paddle 122 of the panel. Next, a transfer molding process is performed to dispose the second encapsulation 236 on the first encapsulation 234 and encapsulating the chip 120, the wires 126 and the ground ring 130. Finally, the panel is etched away to leave the metal layers 124 and the chip paddle 122 exposed out of the first encapsulation 234 and the second encapsulation 236 respectively. To be noted, each lead is protruded from the second encapsulation 236. In addition, each lead has a side wall connecting a bottom and the metal layer 124 is plated on the side wall and the bottom. In such a manner, the metal layer 124 formed on the side wall and the bottom is exposed out of the first encapsulation 234. Accordingly, when the solder materials 144 connect the leads and the substrate 140, the side wall and the bottom can be encompassed by the solder materials 144.

Figure 6:
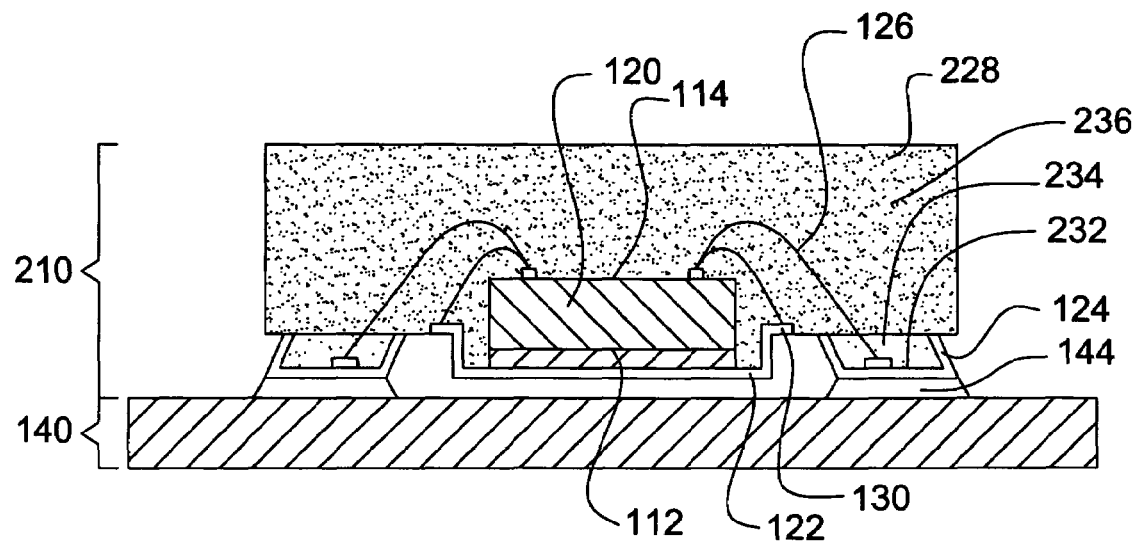
FIG. 6 is a cross-sectional view of FIG. 5 specifically showing the leads with the capability of complying with the substrate.

As mentioned above, in order to reduce the thermal mismatch of the package between the substrate 140, the modulus of the first encapsulation 234 is lower than 10 Mpa, such as silicone with a modulus less than 2 Mpa at the temperature of 25° C. In such manner, the first encapsulation 234 has a lower modulus so that the first encapsulation 234 can be easily to shape into another shapes. Namely, the package 210 is able to comply with the behavior of the substrate 140. Accordingly, referring to FIG. 6, the thermal stress at the solder materials 144 can be reduced to prevent the solder materials 144 from being damaged due to fatigue failure. Consequently, the reliability of such package 210 attached to the substrate 140 will be increased.

Although the invention has been described in considerable detail with reference to certain preferred embodiments, it will be appreciated and understood that various changes and modifications may be made without departing from the spirit and scope of the invention as defined in the appended claims.

What is claimed is:

1. A leadless semiconductor package disposed on a substrate, comprising:
    a plurality of leads, each lead having a recess with a metal layer formed thereon, wherein the leads are disposed on the substrate;
    a solder material connecting the leads and the substrate;
    a chip electrically connected to the leads by a plurality of wires;
    a first encapsulation filled only in the recess of each lead and disposed on the metal layer, wherein the first encapsulation covers the end of the wire that electrically connects the lead and the chip at the end of the wire that contacts the lead; and
    a second encapsulation encapsulating the chip and disposed on the first encapsulation, wherein the first encapsulation has a first modulus relative to shape ability and the second encapsulation has a second modulus relative to shape ability, and the first modulus of the first encapsulation is less than the second modulus of the second encapsulation.

2. The leadless semiconductor package of claim 1, wherein the metal layer is exposed out of the first encapsulation.

3. The leadless semiconductor package of claim 1, further comprising a chip paddle for carrying the chip.

4. The leadless semiconductor package of claim 3, wherein the chip paddle is exposed out of the second encapsulation.

5. The leadless semiconductor package of claim 1, wherein said each lead is protruded from the second encapsulation.

6. The leadless semiconductor package of claim 1, wherein the chip is grounded to the chip paddle.

7. The leadless semiconductor package of claim 1, wherein said each lead further has a side wall connected to the recess and the metal layer is disposed on the side wall.

8. The leadless semiconductor package of claim 7, wherein the metal layer formed on the side wall is exposed out of the first encapsulation.

9. The leadless semiconductor package of claim 1, wherein the first modulus of the first encapsulation is lower than 10 Mpa.

* * * * *